(12) United States Patent
Suzuki et al.

(10) Patent No.: US 10,381,799 B2
(45) Date of Patent: Aug. 13, 2019

(54) OPTICAL MODULE

(71) Applicant: Oclaro Japan, Inc., Kanagawa (JP)

(72) Inventors: Takanori Suzuki, Tokyo (JP); Shigehisa Tanaka, Tokyo (JP)

(73) Assignee: Oclaro Japan, Inc., Kanagawa (JP)

( * ) Notice: Subject to any disclaimer, the term of this patent is extended or adjusted under 35 U.S.C. 154(b) by 0 days.

(21) Appl. No.: 15/944,049

(22) Filed: Apr. 3, 2018

(65) Prior Publication Data

US 2018/0294620 A1  Oct. 11, 2018

(30) Foreign Application Priority Data

Apr. 5, 2017 (JP) .................. 2017-075093

(51) Int. Cl.
*H01S 5/026* (2006.01)
*G02B 6/42* (2006.01)
*H01S 5/022* (2006.01)
*H01S 5/062* (2006.01)
*H01S 5/12* (2006.01)
*H01S 5/18* (2006.01)
*H01S 5/10* (2006.01)

(52) U.S. Cl.
CPC .......... *H01S 5/0267* (2013.01); *G02B 6/4206* (2013.01); *G02B 6/4214* (2013.01); *H01S 5/0228* (2013.01); *H01S 5/0261* (2013.01); *H01S 5/0623* (2013.01); *H01S 5/02216* (2013.01); *H01S 5/02276* (2013.01); *H01S 5/02288* (2013.01); *H01S 5/1085* (2013.01); *H01S 5/12* (2013.01); *H01S 5/18* (2013.01)

(58) Field of Classification Search
CPC . H01S 5/0267; H01S 5/18; H01S 5/12; H01S 5/0261; H01S 5/02276; G02B 6/4214; G02B 6/4206
See application file for complete search history.

(56) References Cited

U.S. PATENT DOCUMENTS

2004/0190836 A1* 9/2004 Kilian .................. G02B 6/4206
385/92
2006/0239605 A1* 10/2006 Palen .................... G02B 6/4206
385/14

(Continued)

FOREIGN PATENT DOCUMENTS

JP  2014-110257 A  6/2014
JP  2017-041618 A  2/2017

*Primary Examiner* — Yuanda Zhang
(74) *Attorney, Agent, or Firm* — Mattingly & Malur, PC

(57) ABSTRACT

An optical module includes a semiconductor laser with an active layer disproportionately positioned closer to the first surface. The semiconductor laser includes a reflector for reflecting the light outgoing from the active layer in a direction along the first surface toward another direction. The active layer and the reflector are monolithically integrated in the semiconductor laser. The optical module includes a carrier formed from a light transmissive material and having a third surface and a fourth surface opposite to each other. The semiconductor laser is mounted on the carrier so as for the light to enter the third surface. The carrier has a lens integrally on the fourth surface. The optical module includes a substrate having an optical waveguide and an optical coupler for guiding the light to the optical waveguide. The optical waveguide and the optical coupler are integrated in the substrate.

5 Claims, 4 Drawing Sheets

(56) References Cited

U.S. PATENT DOCUMENTS

| | | | |
|---|---|---|---|
| 2008/0316872 A1* | 12/2008 | Shimizu | G11S 5/314 |
| | | | 369/13.24 |
| 2010/0006784 A1 | 1/2010 | Mack et al. | |
| 2014/0153605 A1* | 6/2014 | Arimoto | H01S 5/12 |
| | | | 372/50.11 |
| 2017/0054269 A1* | 2/2017 | Tamura | H01S 5/02248 |
| 2017/0207600 A1* | 7/2017 | Klamkin | H01S 5/02292 |

* cited by examiner

OPTICAL MODULE

CROSS-REFERENCE TO RELATED APPLICATION

The present application claims priority from Japanese application JP2017-075093 filed on Apr. 5, 2017, the content of which is hereby incorporated by reference into this application.

BACKGROUND OF THE INVENTION

1. Field of the Invention

This relates to optical modules.

2. Description of the Related Art

To transmit oscillation light generated from a semiconductor laser, techniques by means of a silicon waveguide with a grating coupler have begun to be used, instead of direct optical coupling to an optical fiber. JP2014-110257A discloses a semiconductor laser including a reflector for diverting horizontally-oscillated light toward a back side and a lens for focusing the reflection light, both integrally built in a semiconductor substrate. The semiconductor laser is mounted on a surface of a submount on an opposite side to the lens.

To obtain good optical coupling characteristics, the light focused by the lens should have a beam waist in a desired diameter. Highly efficient optical coupling (i.e. a desired beam waist on the grating-coupler surface) requires a precise shape of the lens and a precise relative positional relationship between the lens and the reflector. The lens and reflector, when integrally build in the same semiconductor substrate, have their positions depending on manufacturing accuracy. The shape of lens, which is formed during processing a semiconductor substrate, depends on processing accuracy.

JP2014-110257A discloses a semiconductor laser. The semiconductor laser, when manufactured with the reflector and the lens positioned in an undesired position relationship, has poor optical coupling characteristics, due to an undesired emitting angle of the emitting light from the semiconductor laser. Besides, due to unchangeability of positions of the reflector and the lens after the manufacture, the semiconductor lasers for the worse may be unavailable for use, possibly affecting their manufacturing yield.

US2010/0006784A1 discloses an example where a semiconductor laser, a lens, and a reflector are independently separate from one another, enabling each component to be flexibly positioned and disposed for optical axis adjustment. The three components, however, should be accurately disposed. Besides, an increased number of components and manufacturing processes are necessary, leading to disadvantageous rising costs. JP2017-041618A discloses an optical module where a semiconductor laser and a lens are integrated.

SUMMARY OF THE INVENTION

This aims to provide optical modules assembled from fewer components and easier for optical axis adjustment.

(1) An optical module may include a semiconductor laser having a first surface and a second surface opposite to each other along a thickness direction, for emitting light from the first surface or the second surface. The semiconductor laser may include an active layer disproportionately positioned closer to the first surface. The semiconductor laser may include a reflector for reflecting the light outgoing from the active layer in a direction along the first surface toward another direction. The active layer and the reflector monolithically are integrated in the semiconductor laser. A carrier may be formed from a light transmissive material and may have a third surface and a fourth surface opposite to each other along a thickness direction, with the semiconductor laser mounted on the carrier so as for the light to enter the third surface. The carrier may have a lens integrally on the fourth surface. A substrate may have an optical waveguide and an optical coupler for guiding the light to the optical waveguide. The optical waveguide and the optical coupler may be integrated in the substrate.

With the reflector monolithically integrated in the semiconductor laser, only fewer components may be necessary. With the lens and the semiconductor laser independently separated, the optical axis adjustment may be easier in such a way as positioning during actual light transmission and reception.

(2) In the optical module according to (1), the reflector may be configured to reflect the light emitted along the first surface, toward the second surface.

(3) In the optical module according to (1) or (2), the semiconductor laser may mainly contain indium phosphide semiconductor, and the carrier may mainly contain silicon.

(4) In the optical module according to any one of (1) to (3), the semiconductor laser may have no function of focusing the light.

(5) In the optical module according to any one of (1) to (4), wherein the optical coupler may be a grating coupler.

(6) In the optical module according to any one of (1) to (5), the carrier may have a main body with the third surface and the fourth surface and a spacer portion integrated on the main body.

(7) The optical module according to any one of (1) to (5) may further include a spacer between the carrier and the substrate.

(8) In the optical module according to any one of (1) to (7), the semiconductor laser and the carrier may be bonded to each other with one of a solder, a brazing material, and an adhesive.

DETAILED DESCRIPTION OF THE INVENTION

Figure 1:
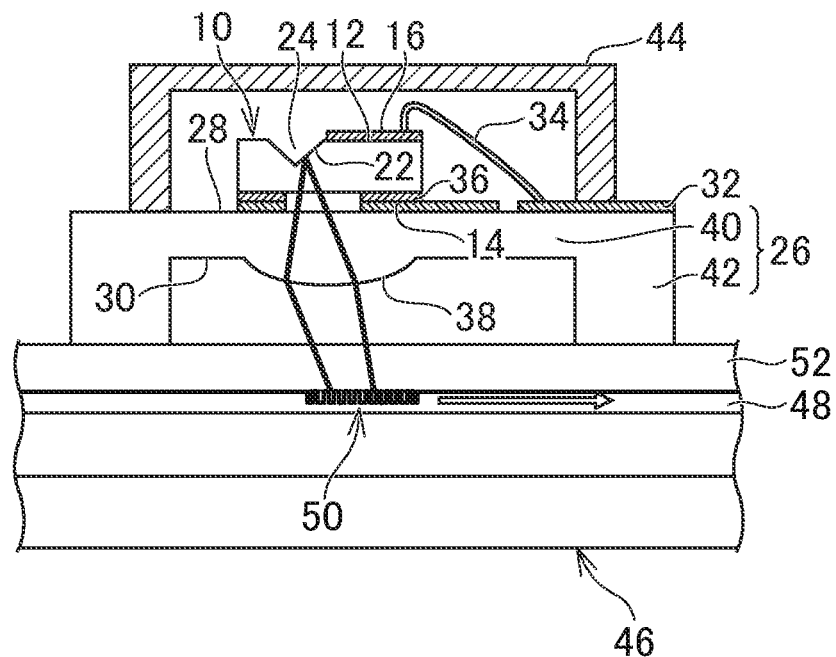
FIG. 1 is a longitudinal sectional view of an optical module in accordance with an embodiment.

Hereinafter, embodiments will be described specifically and in detail with reference to drawings. In all the drawings for describing the embodiments, the same reference numerals are assigned to members having the same function and repetitive description thereof will be omitted. The following drawings merely illustrate examples of the embodiments, and sizes of the drawings and scales described in the examples do not necessarily coincide with each other.

FIG. 1 is a longitudinal sectional view of an optical module in accordance with an embodiment. The optical module includes a semiconductor laser 10. The semiconductor laser 10 is a distributed feedback (DFB) laser and is capable of emitting light of a single wavelength (e.g. 1.3 μm). The DFB laser is suited to a signal source for long-distance large-capacity optical communication because of its single mode oscillation. The semiconductor laser 10 may be not only the DFB laser but also a distributed Bragg reflector (DBR) laser or a modulator-integrated semiconductor laser in which a modulator is integrated for modulating light emitted from a laser portion.

Figure 2:
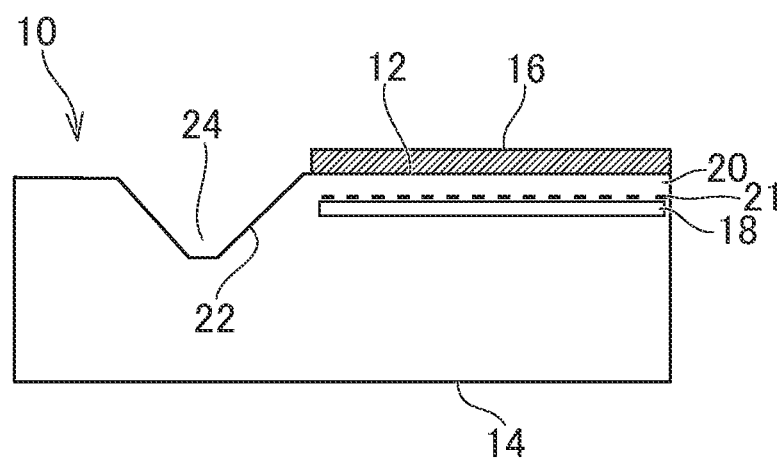
FIG. 2 is a detailed longitudinal sectional view of a semiconductor laser in the optical module in accordance with the embodiment.

FIG. 2 is a detailed longitudinal sectional view of a semiconductor laser 10 in the optical module in accordance with the embodiment. The semiconductor laser 10 has a first surface 12 and a second surface 14 at both sides along a thickness direction. On the first surface 12 is provided an electrode 16. The semiconductor laser 10 has an active layer 18 disproportionately positioned closer to the first surface 12. The active layer 18 extends along the first surface 12, along which a laser is oscillated. On a side of the first surface 12, a grating 21 between the active layer 18 and a clad layer 20 intensifies light of a specific wavelength.

The semiconductor laser 10 has a reflector 22. The first surface 12 has a recess 24, whose inner surface (interface) is the reflector 22. The reflector 22 may have a plane surface inclined at 45 degrees to the optical axis of the light emitted from the active layer 18. The reflector 22 reflects the light, emitted from the active layer 18 along the first surface 12, toward the second surface 14. The light is emitted from the second surface 14, which implies the semiconductor laser 10 is a horizontal resonator surface emission laser.

The active layer 18 and the reflector 22 are monolithically integrated in the semiconductor laser 10. The semiconductor laser 10 mainly contains indium phosphide semiconductor. To form the reflector 22, wet etching is applied. The semiconductor laser 10 has no such function to focus light as a lens has.

As shown in FIG. 1, the optical module includes a carrier 26. The carrier 26 is formed from light-transmissive materials. The carrier 26 has a third surface 28 and a fourth surface 30 at both sides along a thickness direction. On the third surface 28 is formed an interconnect pattern 32. The semiconductor laser 10 is mounted on the third surface 28 of the carrier 26 so as to receive light; the second surface 14 of the semiconductor laser 10 is opposed to the third surface 28 of the carrier 26.

The electrode 16 of the semiconductor laser 10 and the interconnect pattern 32 of the carrier 26 are connected to each other with the wire 34. The semiconductor laser 10 and the carrier 26 are bonded to each other with one of a solder, a brazing material, and an adhesive. The semiconductor laser 10 (specifically, its second surface 14) sits on the interconnect pattern 32 (its portion different from a portion bonded to the wire 34) of the carrier 26. The semiconductor laser 10 and the interconnect pattern 32 are electrically connected as long as bonded with a conductive material such as the solder 36.

The carrier 26 has a lens 38 (e.g. convex lens) integrated on the fourth surface 30. The carrier 26 mainly contains single crystal silicon. The single crystal silicon, which is applicable to dry etching and anisotropic etching with plane orientation dependence (wet etching), is capable of being more precisely processed than indium phosphide semiconductor. Thus, the lens 38 is more precisely formed than formed in the semiconductor laser 10. The substrate may mainly contain silicon and have a layer of SiNO or SiN, instead of being formed only from single crystal silicon.

The carrier 26 has a main body 40 with the third surface 28 and the fourth surface 30 and a spacer portion 42 integrated on the main body 40. The spacer portion 42 is around the lens 38 to keep the lens 38 from being hit by other members below. The carrier 26 has a lid 44 attached thereon to cover the semiconductor laser 10.

The optical module includes a substrate 46, which may be made of silicon. The substrate 46 has a surface layer, in which the optical waveguide 48 is integrated and in which an optical coupler 50 is integrated for guiding light to the optical waveguide 48. The optical coupler 50 is a grating coupler. The light emitted from the semiconductor laser 10, through the lens 38, enters the optical coupler 50 and is coupled to the optical waveguide 48. The optical coupler 50 is preferably on a surface of the substrate 46 to improve coupling efficiency but may have other members disposed on the optical coupler 50. For example, a clad layer 52 may be made from silicon oxide film, on the optical waveguide 48 and the optical coupler 50.

The embodiment requires fewer components since the reflector 22 is monolithically integrated in the semiconductor laser 10. The lens 38 is independently separate from the semiconductor laser 10, enabling easy optical axis adjustment by positioning during actual light transmission and reception. Active alignment, which is a way to optimize the coupling during the laser portion oscillating, is applicable. The optical axis adjustment can be used for positioning between the semiconductor laser 10 and the carrier 26 and can also be used for fixing to the substrate 46 the carrier 26 on which the semiconductor 10 is mounted. Instead of the active alignment, each component can be positioned by passive alignment in such a way as high-precision die bonding, based on a mark provided on each component.

Figure 3:
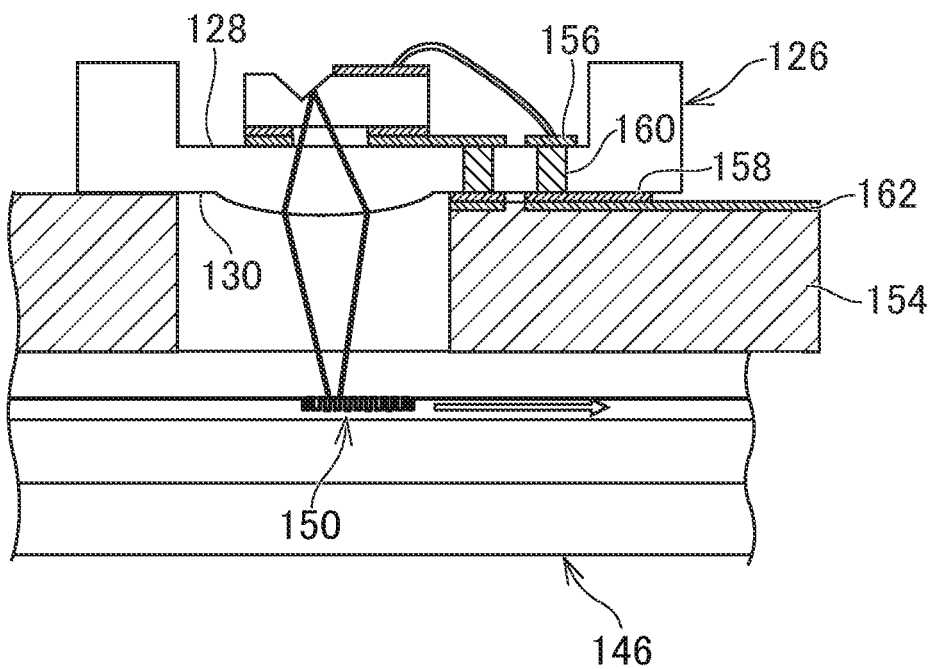
FIG. 3 is a longitudinal sectional view of an optical module in accordance with a variation of the embodiment.

FIG. 3 is a longitudinal sectional view of an optical module in accordance with a variation of the embodiment, where the carrier 126 has no spacer portion. Instead, a spacer 154 is interposed between the carrier 126 and the substrate 146. The spacer 154 is a support member for mounting the carrier 126 thereon and is fixed to the substrate 146. The mounting and fixing is secured through one of a solder, a brazing material, and an adhesive, not shown. The spacer 154 is mounted on the substrate 146 without overlap with the optical coupler 150. The carrier 126 has a first interconnect pattern 156 on a third surface 128 and a second interconnect pattern 158 on a fourth surface 130. The first interconnect pattern 156 and the second interconnect pattern 158 are conductively connected to each other, with a conductive portion 160 penetrating from the third surface 128 to the fourth surface 130. The second interconnect pattern 158 is electrically connected to an interconnect pattern 162 of the spacer 154. Other structures and effects can be extracted from the above embodiment.

Figure 4:
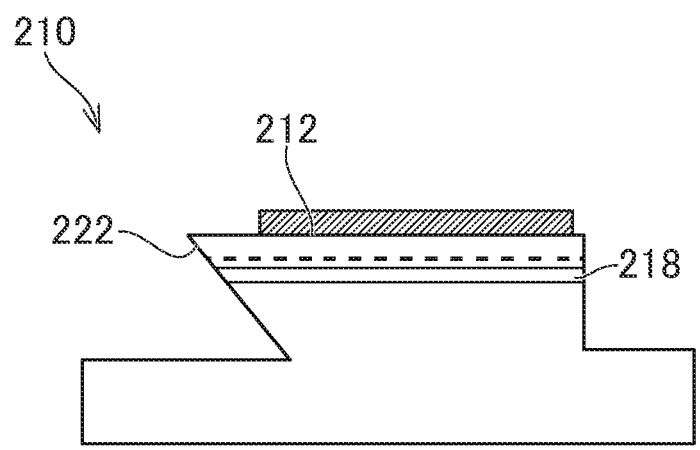
FIG. 4 is a detailed longitudinal sectional view of a semiconductor laser in an optical module in accordance with another variation of the embodiment.

FIG. 4 is a detailed longitudinal sectional view of a semiconductor laser 210 in an optical module in accordance with another variation of the embodiment. The semiconductor laser 210 has a reflector 222, which reflects light, emitted from an active layer 218 along the first surface 212, toward the same first surface 212. The semiconductor laser 210 may be mounted on the carrier 126, with the first surface 212 opposed to the carrier 126 (junction-down bonding). More details can be extracted from the embodiment.

While there have been described what are at present considered to be certain embodiments, it will be understood that various modifications may be made thereto, and it is intended that the appended claims cover all such modifications as fall within the true spirit and scope of the invention.

What is claimed is:

1. An optical module comprising:

a semiconductor laser having a first surface and a second surface opposite to each other along a thickness direction, for emitting light from the first surface or the second surface, the semiconductor laser including an active layer disproportionately positioned closer to the first surface, the semiconductor laser including a reflector for reflecting the light outgoing from the active layer in a direction along the first surface toward another direction, the active layer and the reflector monolithically integrated in the semiconductor laser;

a carrier formed from a light transmissive material and having a third surface and a fourth surface opposite to each other along a thickness direction, with the semiconductor laser mounted on the third surface of the carrier such that the light enters the third surface, the carrier having a lens surface integrally formed on the fourth surface;

a solder or a brazing material which electrically and mechanically connects the semiconductor laser and the carrier; and a substrate having an optical waveguide and an optical coupler for guiding the light to the optical waveguide, the optical waveguide and the optical coupler integrated in the substrate, wherein one of the first surface and the second surface, which faces the third surface, has a first area and a second area, where the first area is electrically and mechanically connected to the carrier without overlapping the second area where the light passes, and the carrier has a main body with the third surface and the fourth surface, and a spacer portion integrated on the fourth surface of the main body, the spacer keeping the lens surface from being in contact with the optical coupler.

2. The optical module according to claim 1, wherein the reflector is configured to reflect the light emitted along the first surface toward the second surface.

3. The optical module according to claim 1, wherein the semiconductor laser mainly contains indium phosphide semiconductor, and the carrier mainly contains silicon.

4. The optical module according to claim 1, wherein the semiconductor laser has no function of focusing the light.

5. The optical module according to claim 1, wherein the optical coupler is a grating coupler.

* * * * *